United States Patent
Lee et al.

(10) Patent No.: US 7,447,862 B2
(45) Date of Patent: Nov. 4, 2008

(54) MEMORY SYSTEM AND TIMING CONTROL METHOD OF THE SAME

(75) Inventors: Jung-Bae Lee, Yongin-si (KR); Hoe-Ju Chung, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 344 days.

(21) Appl. No.: 10/886,926

(22) Filed: Jul. 8, 2004

(65) Prior Publication Data

US 2005/0010741 A1 Jan. 13, 2005

(30) Foreign Application Priority Data

Jul. 11, 2003 (KR) .................. 10-2003-0047399

(51) Int. Cl.
*G06F 13/42* (2006.01)
(52) U.S. Cl. .................. 711/167; 711/168; 711/217; 713/400; 713/401; 714/717
(58) Field of Classification Search .................. 711/167, 711/168, 217; 713/400, 401; 714/717
See application file for complete search history.

(56) References Cited

U.S. PATENT DOCUMENTS

| | | | |
|---|---|---|---|
| 5,802,594 A * | 9/1998 | Wong et al. .................. 711/167 |
| 6,247,138 B1 | 6/2001 | Tamura et al. |
| 2002/0188816 A1* | 12/2002 | Johnson et al. ............. 711/167 |
| 2003/0013340 A1 | 1/2003 | Martin et al. |
| 2003/0177435 A1* | 9/2003 | Budd et al. .................. 714/776 |

FOREIGN PATENT DOCUMENTS

KR 1020030013340 A 2/2003

* cited by examiner

*Primary Examiner*—Sanjiv Shah
*Assistant Examiner*—Jae U Yu
(74) *Attorney, Agent, or Firm*—F. Chau & Assoc., LLC

(57) ABSTRACT

A memory system includes at least one memory module, each of which has a pattern data generating circuit for generating a pattern data, which has a plurality of memories to which a command signal is commonly applied and corresponding data is applied respectively; and a memory controller for respectively applying the command signal and the corresponding data to the plurality of memories, applying a pattern data generating command to the memory module during a timing control operation, calculating time differences among data of reaching each of the plurality of memories using the pattern data outputted from each of the memories and receiving and outputting data using the calculated data reaching time difference. Therefore, a stable data transmission is achieved between the memory controller and the memories.

11 Claims, 5 Drawing Sheets

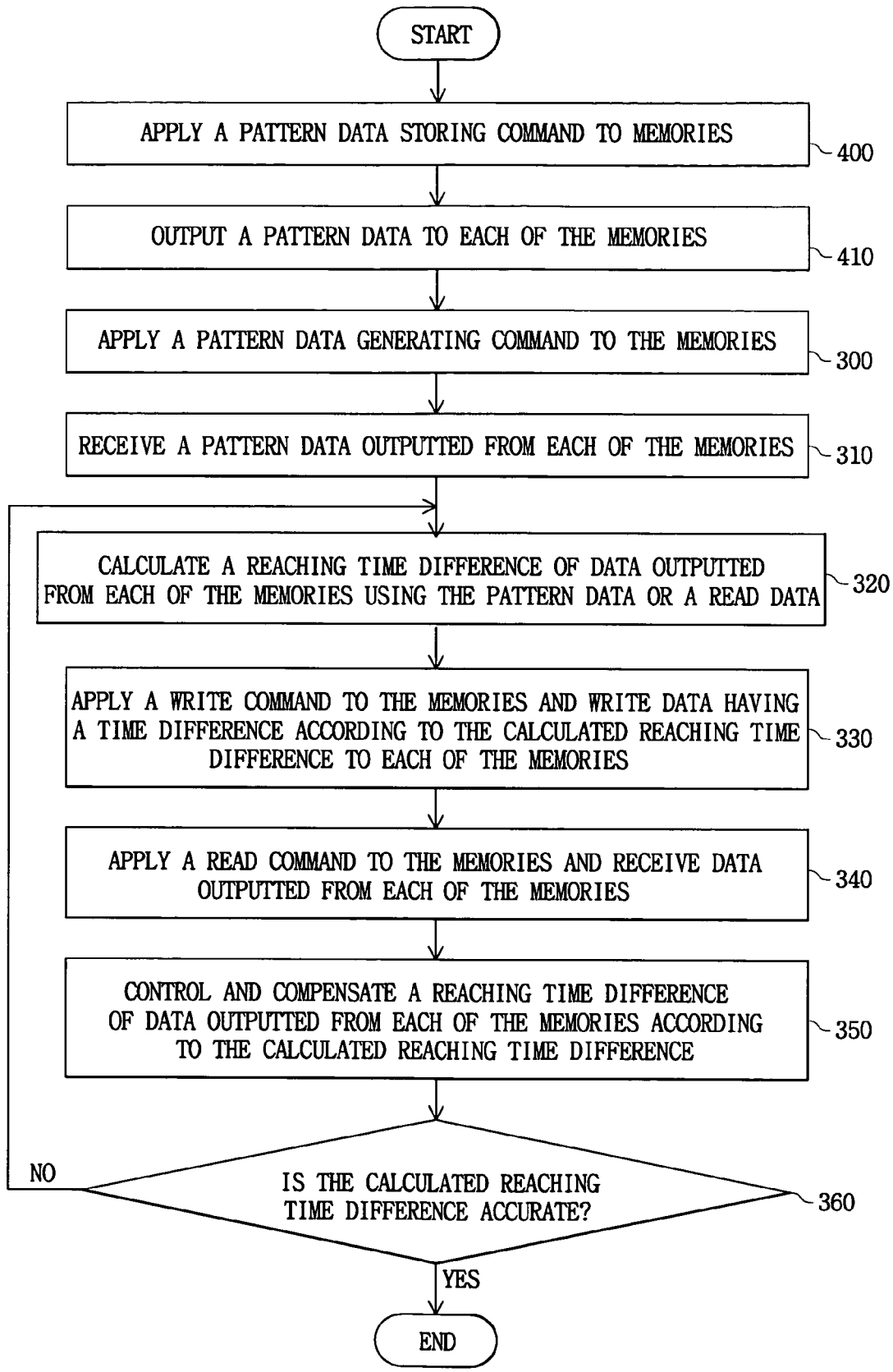

US 7,447,862 B2

MEMORY SYSTEM AND TIMING CONTROL METHOD OF THE SAME

CROSS-REFERENCE TO RELATED APPLICATION

This application claims priority to Korean Patent Application No. 2003-47399, filed Jul. 11, 2003, the disclosure of which is incorporated herein by reference.

BACKGROUND

1. Technical Field

The present invention relates to a memory system and, more particularly, to a memory system and a control method of the same which can remove a timing skew between a memory controller and each of the memories mounted on memory modules.

2. Discussion of the Related Art

A conventional memory system includes a memory controller and a memory module. Each of the memory modules includes a plurality of memories. The memory controller receives/outputs data from/to each of the plurality of memories of the memory module. A command signal is commonly applied to the plurality of memories.

In conventional memory systems, a length of time that a memory controller receives/outputs data from/to each of a plurality of memories is identical, but a length of time that a command signal is applied to a plurality of memories varies from memory to memory. That is, the time that a command signal from the memory controller reaches each of the plurality of memories is different, whereas the time that data from the memory controller reaches each of a plurality of memories is identical.

Therefore, in conventional memory systems, data cannot be accurately written onto each of the plurality of memories from the memory controller, nor can data read from each of the plurality of memories be simultaneously inputted to the memory controller.

A method is suggested that each of the memory modules has one buffer circuit having a function for controlling a timing skew between a command signal and data. However, this method increases the cost of manufacture because each of the memory modules has to include a buffer circuit.

FIG. 1 is a block diagram illustrating a conventional memory system. The memory system of FIG. 1 includes a memory module 100 and a memory controller 200. The memory module 100 includes 8 memories 10-1 to 10-8.

In FIG. 1, reference numerals 22-1 to 22-8 represent data lines between the memory controller 200 and the respective memories 10-1 to 10-8, and reference numerals 20 and 20-1 to 20-8 represent command signal lines between the memory controller 200 and the respective memories 10-1 to 10-8.

As shown in FIG. 1, data is transmitted through the data lines 22-1 to 22-8 between the memory controller 200 and the respective memories 10-1 to 10-8, and a command signal is transmitted through the command signal lines 20 and 20-1 to 20-8 from the memory controller 200 to the memories 10-1 to 10-8.

The memory controller 200 applies a command signal and a write data to the memories 10-1 to 10-8 and receives a read data outputted from the memories 10-1 to 10-8. The memories 10-1 to 10-8 store a write data in response to the command signal sent from the memory controller 200 and output the read data to the memory controller 200.

In the memory system of FIG. 1, read and write data are transmitted between the memory controller 200 and the memories 10-1 to 10-8 at the same time, but the time that command signals reach the respective memories 10-1 to 10-8 is different. This is because the load of the signal line increases as the memories are located further away from the memories 10-4 and 10-5, thus the time that a command signal reaches these memories is delayed. As a consequence, the command signal reaches the memories 10-4 and 10-5 the earliest and reaches the memories 10-1 and 10-8 the latest.

Therefore, in the memory system of FIG. 1, during a write and read operation, data cannot be written accurately because the time that each command signal reaches each of the memories 10-1 to 10-8 is different, and the time that data being read from the memories 10-1 to 10-8 to the memory controller 200 is different as well.

For the foregoing reason, the conventional memory system cannot perform a stable data transmission during a write and read operation.

SUMMARY OF THE INVENTION

A memory system is provided, comprising a memory module that can compensate a timing skew between a command signal applied to memories and data received/outputted from/to each of the memories.

According to an embodiment of the present invention, a memory system is provided, comprising: at least one memory module, each of which has a pattern data generating circuit for generating a pattern data, which has a plurality of memories to which a command signal is commonly applied and corresponding data is applied respectively; and a memory controller for respectively applying the command signal and the corresponding data to the plurality of memories, applying a pattern data generating command to the memory module during a timing control operation, calculating time differences among data reaching each of the plurality of memories using the pattern data outputted from each of the memories, and receiving and outputting data using the calculated data reaching time difference.

According to another embodiment of the present invention, a memory system is provided, comprising: at least one memory module, each of which has a pattern data generating circuit for generating a pattern data, and each of which has a plurality of memories to which a command signal is commonly applied and corresponding data is applied respectively; and a memory controller for respectively applying the command signal and the corresponding data to the plurality of memories, applying a pattern data storing command to the memory module during a timing control operation, receiving the pattern data from each of the plurality of memories, applying a pattern data generating command to the memory module, calculating time differences among data reaching each of the plurality of memories using the pattern data outputted from each of the memories, and receiving and outputting data using the calculated data reaching time difference.

The memory controller, when the data reaching time difference is calculated, outputs data having a time difference according to the calculated reaching time difference to each of the plurality of memories, receiving data outputted from each of the plurality of memories to compensate a time difference of data according to the calculated reaching time difference, and determining whether or not the calculated reaching time difference is accurate.

An interval of the pattern data has a time difference greater than a time difference between data reaching the memory controller the earliest and data reaching the memory controller the latest among data outputted from each of the plurality of memories.

According to another embodiment of the present invention, a timing control method of a memory system is provided, including at least one memory module having a plurality of memories, and a memory controller applying a command signal and a corresponding data to the plurality of memories respectively, and receiving data outputted from each of the plurality of memories, the method comprising: applying a pattern data generating command to the plurality of memories; calculating a data reaching time difference of each of the plurality of memories using a pattern data outputted from each of the plurality of memories; and receiving and outputting data using the calculated data reaching time difference.

The timing control method of the memory system further includes applying a pattern data storing command to the memory module; and inputting the pattern data to each of the plurality of memories.

BRIEF DESCRIPTION OF THE DRAWINGS

The features of the present invention will become more apparent to those of ordinary skill in the art by describing in detail preferred embodiments thereof with reference to the attached drawings in which:

FIG. 5 is a flow chart illustrating operation of a memory controller of the memory system according to this preferred embodiment of the present invention.

DETAILED DESCRIPTION OF THE PREFERRED EMBODIMENTS

Figure 1:
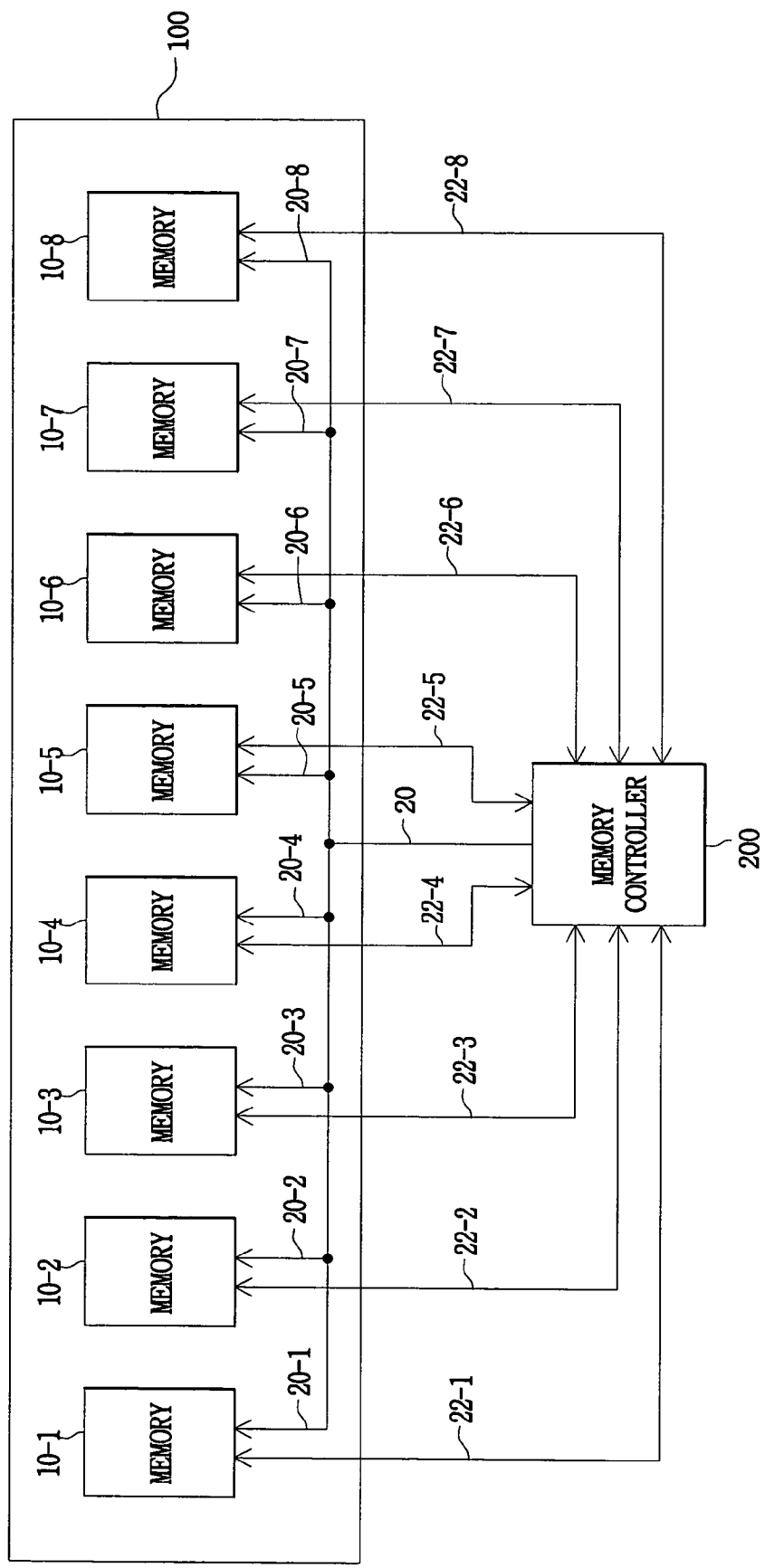
FIG. 1 is a block diagram illustrating a conventional memory system.

The embodiments of the present invention will now be described in further detail hereinafter with reference to the accompanying drawings. In the drawings, the size of certain parts are exaggerated for clarity. Like numbers refer to like elements throughout the specification. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 2:
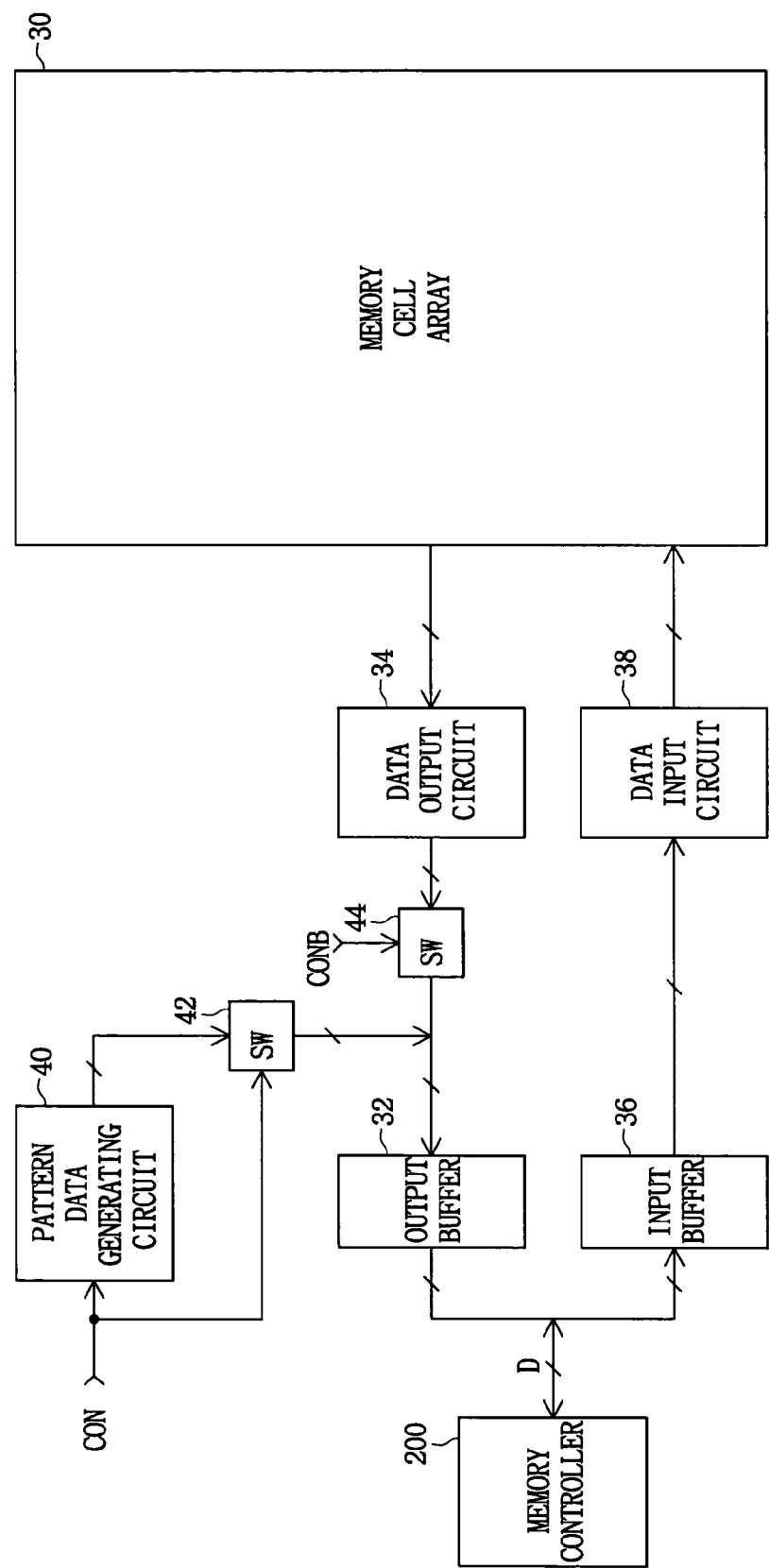
FIG. 2 is a block diagram of a memory mounted on a memory module of a memory system according to a preferred embodiment of the present invention.

FIG. 2 is a block diagram of a memory mounted on a memory module of a memory system according to a preferred embodiment of the present invention. The memory of FIG. 2 includes a memory cell array 30, an output buffer 32, a data output circuit 34, an input buffer 36, a data input circuit 38, a pattern data generating circuit 40, and switches SW 42 and 44.

Functions of components of the memory of FIG. 2 are explained below.

The input buffer 36 buffers data received externally during a write operation. The data input circuit 38 receives and processes the buffered data outputted from the input buffer 36 during a write operation. The memory cell array 30 stores data outputted from the data input circuit 38 and outputs data stored. The data output circuit 34 receives and processes data outputted from the memory cell array 30 during a read operation. The output buffer 32 buffers data outputted from the data output circuit 34 and outputs it to the memory controller. The pattern data generating circuit 40 generates pattern data which is toggled at a predetermined interval in response to a control signal CON. The switch 42 is turned on in response to a control signal CON, and the switch 44 is turned on in response to an inverted control signal CONB. The inverted control signal CONB is an inverted signal of the control signal CON. Therefore, when the switch 42 is turned on, the switch 44 is turned off, and vice versa.

In the memory of FIG. 2, when a control signal CON is generated, the switch 42 is turned on whereas the switch 44 is turned off. The pattern data generating circuit 40 generates pattern data which is toggled at a predetermined interval in response to a control signal CON. Here, the toggling interval of the pattern data should be greater than a time difference between a time that a command signal reaches the memories 10-4 and 10-5 and a time a command signal reaches the memories 10-1 and 10-8.

Figure 3:
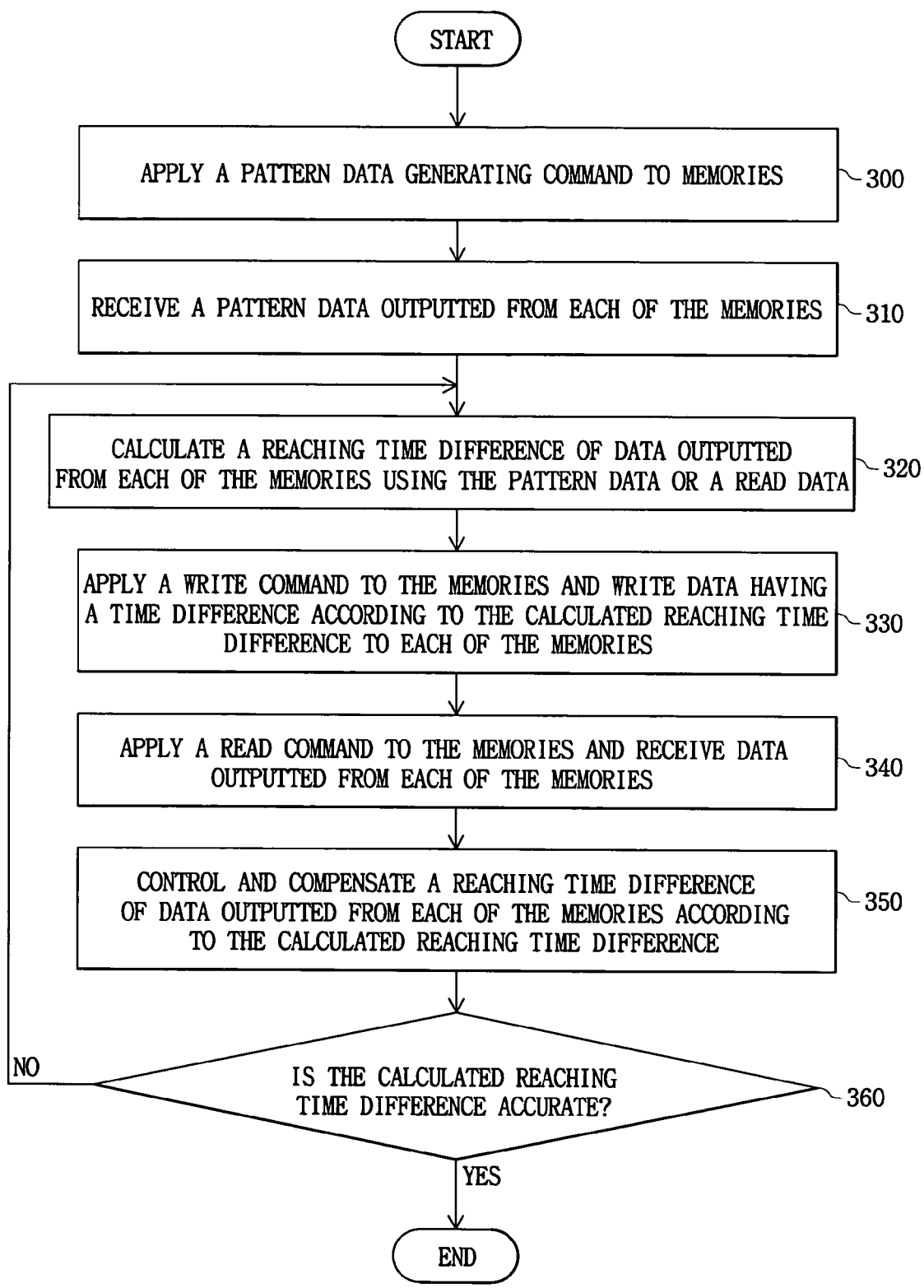
FIG. 3 is a flow chart illustrating operation of a memory controller of the memory system according to the preferred embodiment of the present invention.

FIG. 3 is a flow chart illustrating operation of a memory controller of the memory system according to the preferred embodiment of the present invention.

First, the memory controller 200 applies a pattern data generating command to the memories 10-1 to 10-8 having the same configuration as described in FIG. 2 (step 300). Each of the memories 10-1 to 10-8 generates a control signal CON in response to the pattern data generating command. Therefore, the switch 42 of each of the memories 10-1 to 10-8 is turned on and the switch 44 is turned off, so that a pattern data is outputted from the pattern data generating circuit 40.

The pattern data is received by the memory controller from each of the memories 10-1 to 10-8 (step 310).

The memory controller then calculates the time differences among data reaching each of the memories 10-1 to 10-8, hereafter "reaching time difference" using the pattern data or a read data (step 320). That is, a timing skew of data outputted from each of the memories 10-1 to 10-8 is calculated.

A write command is applied to the memories 10-1 to 10-8, and data having a time difference according to a reaching time difference calculated in step 320 is written to each of the memories 10-1 to 10-8 (step 330). Here, the time when data is applied to the memories 10-4 and 10-5 is the earliest, whereas the time when data is applied to the memories 10-1 and 10-8 is the latest.

A read command is applied to the memories 10-1 to 10-8, and a read data outputted from each of the memories 10-1 to 10-8 is inputted (step 340). Here, data outputted from the memories 10-4 and 10-5 reaches the memory controller the earliest, whereas data outputted from the memories 10-1 and 10-8 reaches the memory controller the latest.

Thus, a reaching time difference of a read data outputted from each of the memories 10-1 to 10-8 is controlled and compensated by the reaching time difference calculated in step 320 and step 350.

Whether the reaching time difference of a read data outputted from each of the memories 10-1 to 10-8 is accurately compensated is determined in step 350 (step 360). That is, it is determined whether or not the reaching time difference of a read data is exactly compensated so that reaching time of read data outputted from the memories 10-1 to 10-8 are controlled to be identical in the memory controller 200.

If a reaching time difference (i.e., timing shew) calculated is accurate, the operation is finished, whereas if not accurate, the process goes to step 320.

When a pattern data generating command is applied in step 300, each of the memories 10-1 to 10-8 generates a control signal CON. Here, a pattern data generating command can be generated by combining command signals generated from the memory controller 200. In addition, without applying a separate pattern data generating command, the state of the control signal CON can be set by applying a mode setting command during a mode setting operation of the memories 10-1 to 10-8 and receiving a mode setting code corresponding to a pattern data generating command. This technique is commonly used in memory systems.

As described above, the memory controller factors in the time difference of the command signal applied to each of the memories of the memory module of the memory system, when applies data to each of the memories and controls the time difference of data received from the memories, thereby accurately write/read data onto/from the memories.

Figure 4:
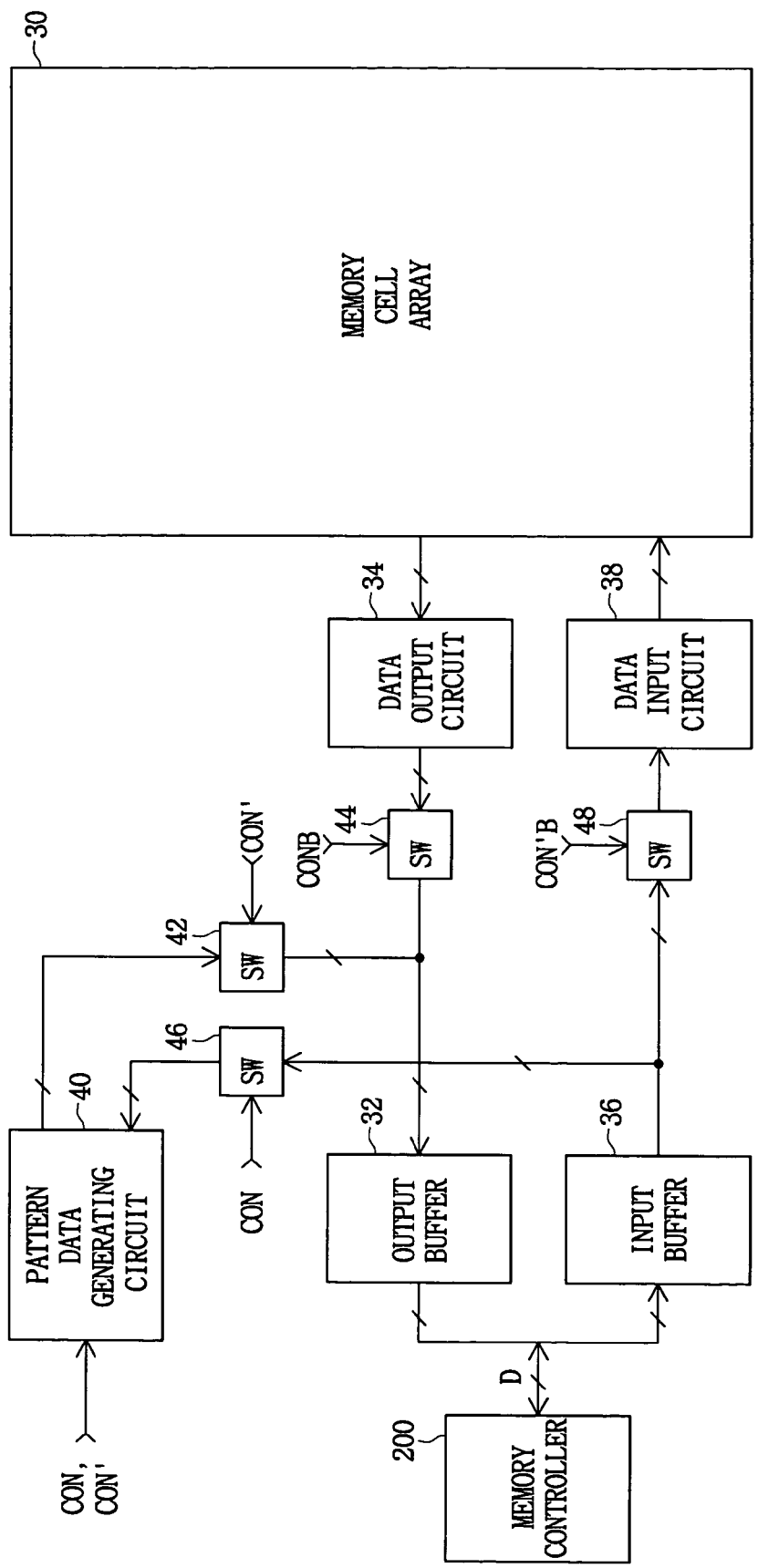
FIG. 4 is a block diagram of a memory mounted on a memory module of a memory system according to another preferred embodiment of the present invention.

FIG. 4 is a block diagram of a memory mounted on a memory module of a memory system according to another preferred embodiment of the present invention. Switches 46 and 48 are added to the memory of FIG. 2, and the pattern data generating circuit 40 of FIG. 2 is replaced with a pattern data generating circuit 40'.

Like reference numerals of FIGS. 2 and 4 denote like parts, and functions of added components are explained below.

The pattern data generating circuit 40' stores pattern data which is toggled at a predetermined interval in response to a control signal CON' and outputs pattern data stored in response to a control signal CON. The switch 46 is turned on in response to a control signal CON', and the switch 48 is turned on in response to an inverted control signal CON'B. The inverted control signal CON'B is an inverted signal of the control signal CON. Therefore, when the switch 46 is turned on, the switch 48 is turned off, and vice versa.

In the memory of FIG. 4, when a control signal CON' is generated, the switch 46 is turned on whereas the switch 48 is turned off. The memory controller 200 outputs the pattern data to the memories 10-1 to 10-8. Here, the toggling interval of the pattern data stored in each of the memories 10-1 to 10-8 should be greater than a time difference between a time that a command signal reaches the memories 10-4 and 10-5 and a time a command signal reaches the memories 10-1 and 10-8.

FIG. 5 is a flow chart illustrating an operation of a memory controller of the memory system according to the preferred embodiment of the present invention.

First, the memory controller 200 applies a pattern data storing command to the memories 10-1 to 10-8 having the same configuration as described in FIG. 4 (step 400). The memories 10-1 to 10-8 generate a control signal CON' in response to the pattern data storing command. Therefore, the switch 46 of each of the memories 10-1 to 10-8 is turned on and the switch 48 is turned off.

Next, the pattern data is outputted to each of the memories 10-1 to 10-8 (step 410). Therefore, each of the memories 10-1 to 10-8 stores pattern data received from the memory controller 200.

The subsequent process is identical to that of FIG. 3 and thus omitted.

Furthermore, when the pattern data storing command is applied in step 400, each of the memories 10-1 to 10-8 internally generates a control signal CON'. The pattern data storing command can be generated by the same method as the pattern data generating command described above.

The memory module having the memories of FIG. 4 and the memory system having the memory controller which performs operation of FIG. 5 can store various pattern data in a pattern data generating circuit of each of the memories. That is, the memory module having the memories of FIG. 2 and the memory system having the memory controller which performs operation of FIG. 3 generates only pattern data pre-specified by the pattern data generating circuit, whereas the memory module having the memories of FIG. 4 and the memory system having the memory controller which performs operation of FIG. 5 can store and generate various pattern data.

As described above, each of the memories has the pattern data generating circuit, the memory controller calculates a reaching time difference of a pattern data outputted from each of the memories so that data is outputted from the memory controller with a time difference; on the other hand, the time difference of the data inputted to the memory controller is compensated by the memory controller. Therefore, the memory system and the timing control method according to the present invention can perform a stable data transmission between the memory controller and the memories.

What is claimed is:

1. A memory system, comprising:
   a memory module having a plurality of memories to which a command signal is commonly applied and corresponding data is applied respectively, each of the plurality of memories having a pattern data generating circuit for generating a pattern data;
   a switching circuit controlled by a control signal from the memory module; and
   a memory controller for respectively applying the command signal and the corresponding data to the plurality of memories, applying a pattern data generating command to the memory module during a timing control operation and receiving the pattern data from each of the plurality of memories in response thereto, calculating data reaching time differences among data reaching each of the plurality of memories by using either the pattern data outputted from each of the memories or read data from each of the memories of the memory module, as selected by the switching circuit in response to the control signal, and receiving and outputting data using the calculated data reaching time differences, so that reaching times of data output from the plurality of memories are controlled to be identical in the memory controller,
   wherein the memory controller, when the data reaching time difference is calculated, outputs data having a time difference according to the calculated reaching time difference to each of the plurality of memories, receiving data outputted from each of the plurality of memories to compensate the time difference of data according to the calculated data reaching time differences, and determining whether or not each calculated data reaching time difference is accurate and upon determining that the data reaching time difference is inaccurate, the memory controller recalculates the data reaching time difference,
   wherein the pattern data generating circuit toggles the pattern data in response to a control signal and a toggle interval of the pattern data is greater than a time difference between earliest data reaching the memory controller and latest data reaching the memory controller among the data outputted from each of the plurality of memories.

2. The memory system of claim 1, wherein the pattern data generating circuit is enabled by the pattern data generating command outputted from the memory controller to generate the pattern data.

3. The memory system of claim 1, wherein:
   the memory controller applies a pattern data storing command to the memory module during a timing control operation, and receives the pattern data from each of the plurality of memories.

4. The memory system of claim 3, wherein the memory controller, when each data reaching time difference is calculated, outputs data having a time difference according to the calculated reaching time differences to each of the plurality of memories, receives data outputted from each of the plurality of memories to compensate the time difference of data according to the respective calculated reaching time difference, and determines whether the calculated reaching time difference is accurate and upon determining that the data reaching time difference is inaccurate, the memory controller recalculates the data reaching time difference.

5. A timing control method of a memory system including at least one memory module having a plurality of memories, and a memory controller applying a command signal and corresponding data to the plurality of memories respectively, and receiving data outputted from each of the plurality of memories, the method comprising:

applying a pattern data generating command to the plurality of memories and receiving the pattern data from each of the memories in response thereto;

selecting either a pattern data outputted from each of the plurality of memories or read data from each of the plurality of memories using a switching circuit controlled by a control signal from the memory module;

calculating a data reaching time difference for each of the plurality of memories by using either the pattern data outputted from each of the plurality of memories or the read data from each of the plurality of memories;

receiving and outputting data using the calculated data reaching time differences, so that reaching times of data output from the plurality of memories are controlled to be identical;

applying a pattern data storing command to the memory module; and inputting the pattern data to each of the plurality of memories; and toggling the pattern data in response to a control signal, wherein a toggle interval of the pattern data is greater than a time difference between earliest data reaching the memory controller and latest data reaching the memory controller among data outputted from each of the plurality of memories.

6. The method of claim 5, wherein the step of receiving and outputting data includes:

outputting data having a time difference according to the calculated time difference to each of the plurality of memories, respectively;

receiving data outputted from each of the plurality of memories according to the data reaching time difference calculated in the step of calculating;

compensating the reaching time difference of data outputted from each of the memories according to the data reaching time difference calculated in the step of calculating; and determining whether the calculated reaching time difference is accurate.

7. A memory controller for compensating a timing skew between a command signal applied to a plurality of memories and data received/outputted from/to each of the plurality of memories, wherein the memory controller respectively applies a command signal and corresponding data to the plurality of memories, applies a pattern data generating command to a memory module during a timing control operation and receives the pattern data from the plurality of memories in response thereto, calculates data reaching time differences among data reaching each of the plurality of memories by using either the pattern data outputted from each of the plurality of memories or read data from each of the plurality of memories, as selected by a switching circuit controlled by a control signal from the memory module, and receives and outputs data using the calculated data reaching time differences, so that the reaching times of data output from the plurality of memories are controlled to be identical in the memory controller, wherein when the data reaching time difference is calculated, the memory controller outputs data having a time difference according to the calculated data reaching time difference to each of the plurality of memories, receives data outputted from each of the plurality of memories to compensate the time difference of data according to the calculated data reaching time difference, and determines whether the calculated data reaching time difference is accurate, and wherein a toggle interval of the pattern data is greater than a time difference between earliest data reaching the memory controller and latest data reaching the memory controller among the data outputted from each of the plurality of memories.

8. The memory controller of claim 7, wherein the memory controller outputs the pattern data generating command to enable a pattern data generating circuit to generate the pattern data.

9. The memory controller of claim 7, wherein the memory controller applies a pattern data storing command to the memory module during a timing control operation, and receives the pattern data from each of the plurality of memories.

10. The memory controller of claim 9, wherein when the data reaching time difference is calculated, data having a time difference according to the calculated reaching time difference is output to each of the plurality of memories, data outputted from each of the plurality of memories is received to compensate the time difference of data according to the calculated reaching time difference, and it is determined whether the calculated reaching time difference is accurate and upon determining that the data reaching time difference is inaccurate, the memory controller recalculates the data reaching time difference.

11. The memory controller of claim 9, wherein a pattern data generating circuit stores the pattern data outputted from the memory controller in response to the pattern data storing command outputted from the memory controller, and generates the pattern data stored in response to the pattern data generating command outputted from the memory controller.

* * * * *